United States Patent
Chang et al.

(10) Patent No.: US 11,526,081 B2
(45) Date of Patent: Dec. 13, 2022

(54) DUMMY INSERTION FOR IMPROVING THROUGHPUT OF ELECTRON BEAM LITHOGRAPHY

(71) Applicant: Taiwan Semiconductor Manufacturing Co., Ltd., Hsin-Chu (TW)

(72) Inventors: Shih-Ming Chang, Hsinchu (TW); Wen Lo, Taipei (TW); Chun-Hung Liu, Kaohsiung (TW); Chia-Hua Chang, New Taipei (TW); Hsin-Wei Wu, Hsinchu (TW); Ta-Wei Ou, Taichung (TW); Chien-Chih Chen, Tainan (TW); Chien-Cheng Chen, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/366,319

(22) Filed: Jul. 2, 2021

(65) Prior Publication Data

US 2021/0405534 A1 Dec. 30, 2021

Related U.S. Application Data

(63) Continuation of application No. 16/138,402, filed on Sep. 21, 2018, now Pat. No. 11,054,748.

(51) Int. Cl.
| G03F 7/20 | (2006.01) |
| G03F 1/36 | (2012.01) |
| G03F 1/78 | (2012.01) |

(52) U.S. Cl.
CPC .............. G03F 7/2061 (2013.01); G03F 1/36 (2013.01); G03F 1/78 (2013.01)

(58) Field of Classification Search
CPC .................................. G03F 1/36; G03F 7/2061
See application file for complete search history.

(56) References Cited

U.S. PATENT DOCUMENTS

| 4,463,265 | A | 7/1984 | Owen et al. |
| 6,432,588 | B1 | 8/2002 | Tzu et al. |
| 6,872,507 | B2 | 3/2005 | Tzu et al. |
| 8,524,427 | B2 | 9/2013 | Shin et al. |
| 9,436,788 | B2 | 9/2016 | Lin et al. |
| 2004/0088149 | A1 | 5/2004 | Cobb |
| 2005/0136341 | A1 | 6/2005 | Park et al. |
| 2006/0246362 | A1 | 11/2006 | Yasuzato |
| 2008/0116397 | A1 | 5/2008 | Yoshida et al. |
| 2009/0162760 | A1 | 6/2009 | Hoshino et al. |
| 2009/0162789 | A1 | 6/2009 | Pain et al. |
| 2009/0176168 | A1 | 7/2009 | Ogino et al. |
| 2009/0309162 | A1 | 12/2009 | Baumgartner |
| 2014/0357060 | A1 | 12/2014 | Liu |
| 2015/0187773 | A1 | 7/2015 | Niimi et al. |
| 2016/0293736 | A1 | 10/2016 | Cheng et al. |
| 2016/0343623 | A1 | 11/2016 | Foge et al. |
| 2016/0372473 | A1 | 12/2016 | Cheng |
| 2017/0176849 | A1 | 6/2017 | Lin et al. |
| 2017/0250183 | A1 | 8/2017 | Brunco |
| 2018/0061864 | A1 | 3/2018 | Cheng |
| 2018/0315663 | A1 | 11/2018 | Bao et al. |

FOREIGN PATENT DOCUMENTS

| CN | 105093807 A | 11/2015 |
| EP | 2284864 A1 | 2/2011 |
| KR | 20160136296 A | 11/2016 |
| KR | 20170121667 A | 11/2017 |
| KR | 20180016351 A | 2/2018 |
| TW | 425492 | 3/2001 |
| TW | 444272 B | 7/2001 |
| WO | 2006104139 | 10/2006 |
| WO | 2008044479 | 4/2008 |

*Primary Examiner* — Christopher G Young
(74) *Attorney, Agent, or Firm* — Haynes and Boone, LLP

(57) ABSTRACT

An electron beam lithography system and an electron beam lithography process are disclosed herein for improving throughput. An exemplary method for increasing throughput achieved by an electron beam lithography system includes receiving an integrated circuit (IC) design layout that includes a target pattern, wherein the electron beam lithography system implements a first exposure dose to form the target pattern on a workpiece based on the IC design layout. The method further includes inserting a dummy pattern into the IC design layout to increase a pattern density of the IC design layout to greater than or equal to a threshold pattern density, thereby generating a modified IC design layout. The electron beam lithography system implements a second exposure dose that is less than the first exposure dose to form the target pattern on the workpiece based on the modified IC design layout.

20 Claims, 9 Drawing Sheets

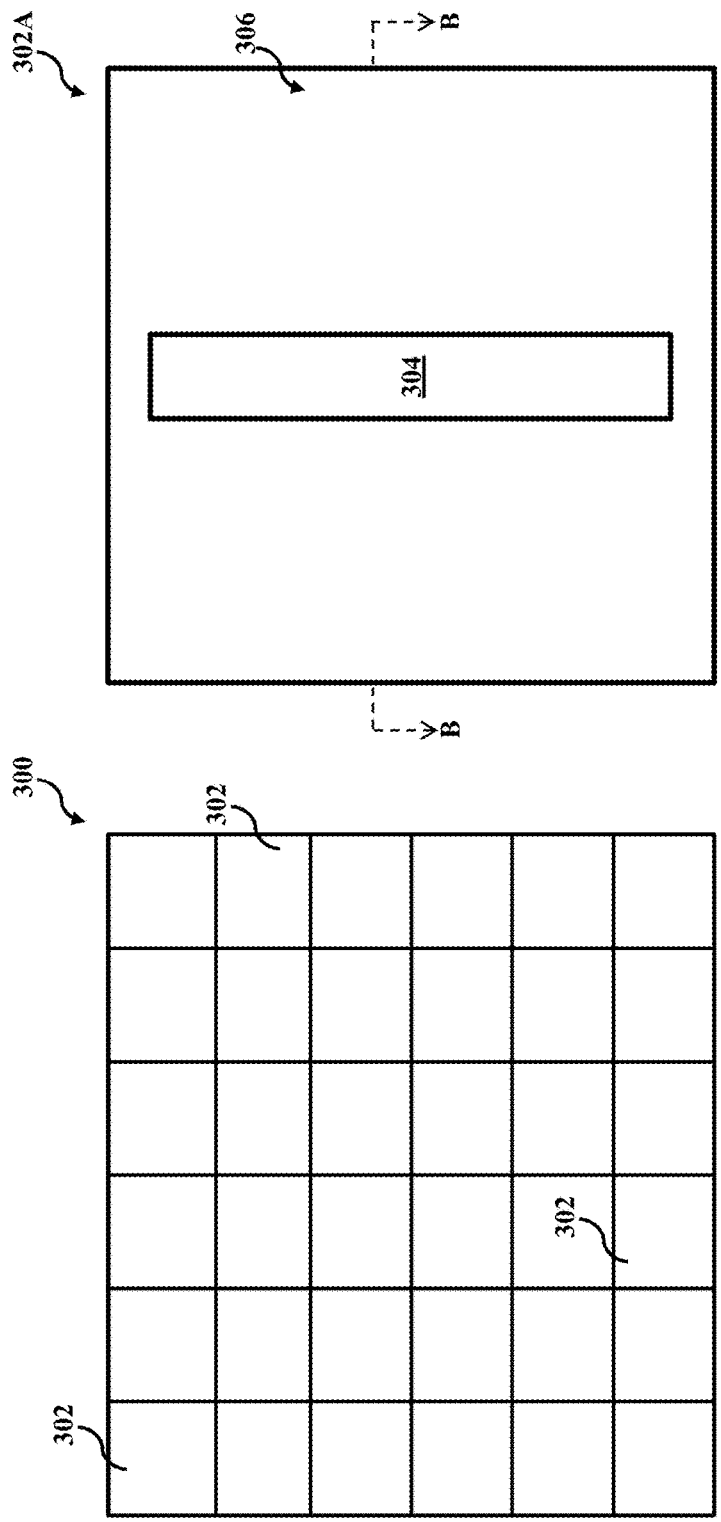
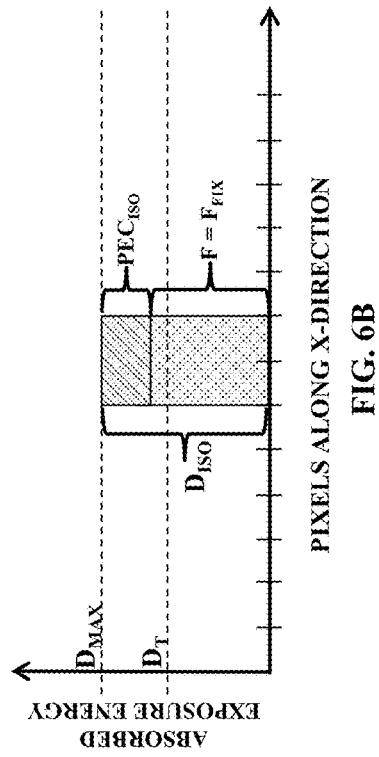
FIG. 6A
FIG. 6B
FIG. 5

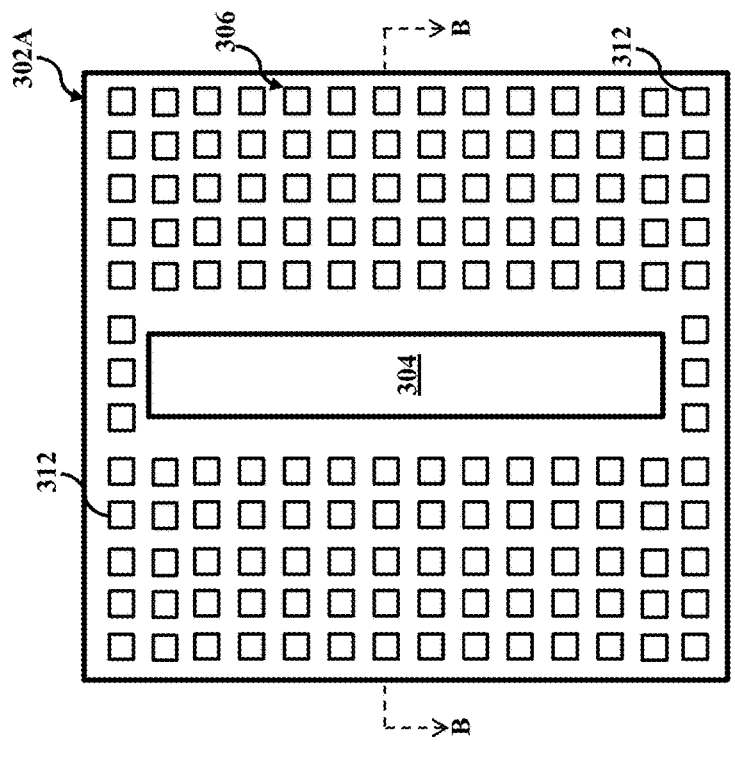
FIG. 8A
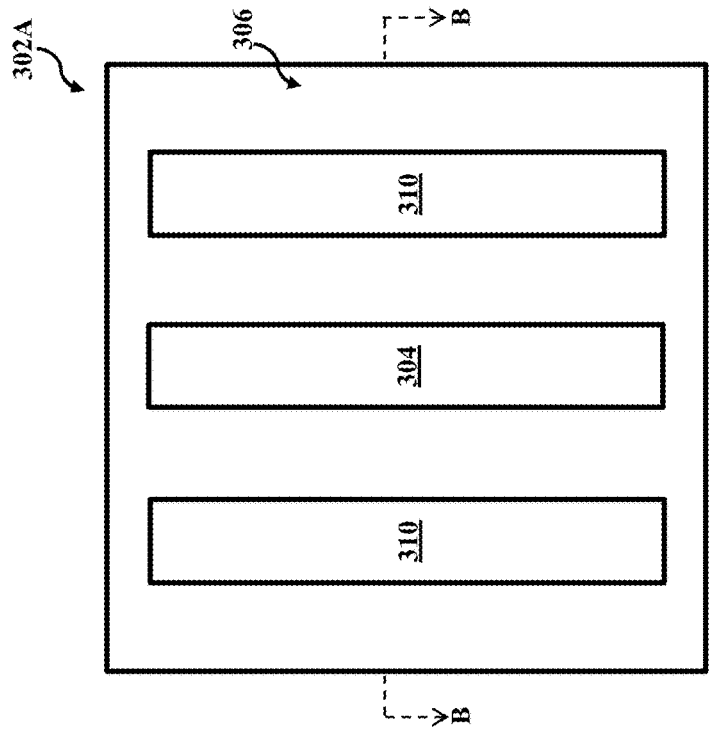
FIG. 7A
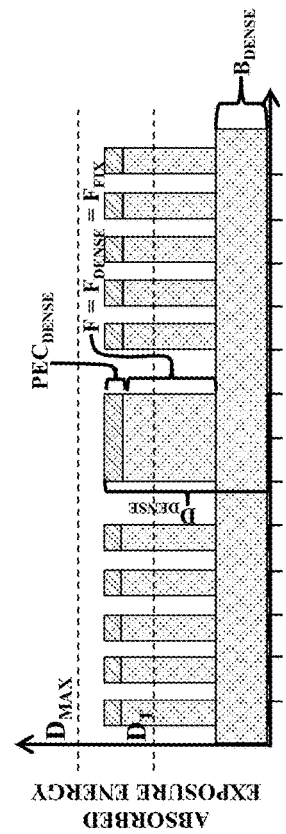
FIG. 8B
FIG. 7B and are used for illustration purposes only. In
DUMMY INSERTION FOR IMPROVING THROUGHPUT OF ELECTRON BEAM LITHOGRAPHY This is a continuation application of U.S. patent application Ser. No. 16/138,402, filed Sep. 21, 2018, the entire disclosure of which is incorporated herein by reference.

BACKGROUND

Integrated circuit (IC) design becomes more challenging as IC technologies continually progress towards smaller feature sizes, such as 32 nanometers, 28 nanometers, 20 nanometers, and below. For example, when fabricating IC devices, IC device performance is seriously influenced by lithography printability capability, which indicates how well a final wafer pattern formed on a wafer corresponds with a target pattern defined by an IC design layout. Various methods (such as immersion lithography, multiple patterning lithography, extreme ultraviolet (EUV) lithography, and charged particle beam lithography) have been introduced for enhancing lithography printability. In particular, charged particle beam lithography, which involves writing an IC pattern on a workpiece using a charged particle beam (for example, an electron beam) without a reticle (or mask), can form IC features smaller than a resolution of light. Throughput of charged particle beam lithography can significantly constrain its usefulness, particularly for mass fabrication. Accordingly, although existing charged particle beam lithography systems and charged particle beam lithography methods have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 5 is a simplified diagrammatic view of an IC design layout according to various aspects of the present disclosure.

FIG. 6A is a simplified diagrammatic view of an exemplary pattern area of an IC design layout according to various aspects of the present disclosure.

FIG. 6B depicts energy absorbed by a recording medium when written with the pattern depicted in FIG. 6A along line B-B according to various aspects of the present disclosure FIGS. 7A-10A are simplified diagrammatic views of a pattern area of an IC design layout after various dummy insertions according to various aspects of the present disclosure.

FIGS. 7B-10B depict energy absorbed by a recording medium when written with patterns depicted in FIGS. 7A-10A (including, for example, a main pattern and a dummy pattern) along line B-B according to various aspects of the present disclosure.

DETAILED DESCRIPTION

Figure 1:
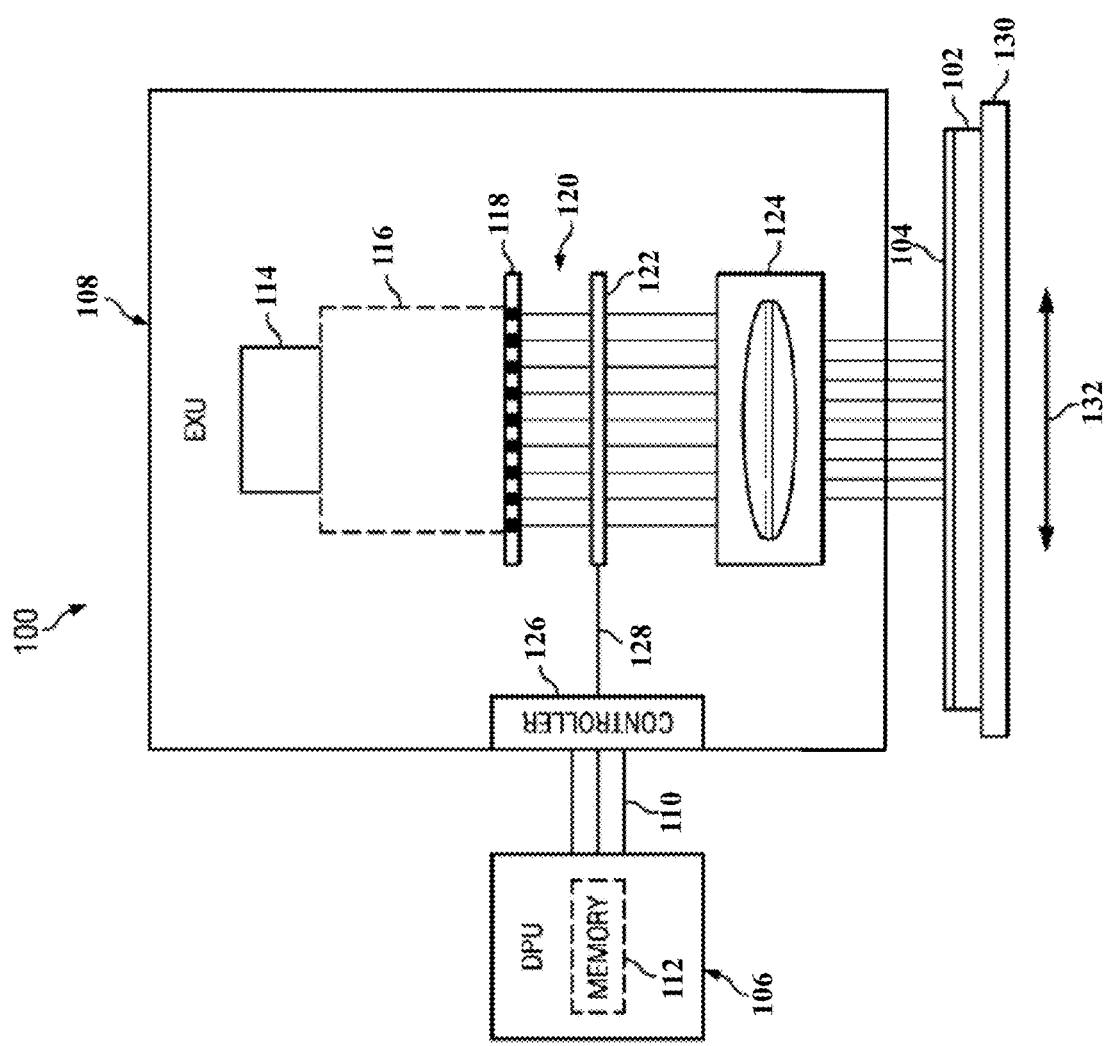
FIG. 1 is a simplified diagrammatic view of an electron beam system according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

The present disclosure provides an electron beam lithography system and electron beam lithography method for use in manufacturing integrated circuit (IC) devices. Electron beam lithography transfers a target pattern (for example, defined by an IC design layout) to a recording medium (for example, an energy sensitive resist layer or a resist layer) using an electron beam(s). In particular, the electron beam is focused onto the recording medium, such that the target pattern is written directly into the recording medium by the electron beam without using a reticle (or mask). Since the recording medium is sensitive to the electron beam, exposed portions of the recording medium chemically change (for example, exhibiting increased or decreased solubility to a developing solution). A developing process is then performed that dissolves exposed (or non-exposed) portions of the recording medium depending on characteristics of the recording medium and characteristics of the developing solution used in the developing process, thereby forming a resist pattern that corresponds with the target pattern. The resist pattern in the recording medium can be transferred to a workpiece. For example, the patterned recording medium is used as an etch mask (also referred to as an etching hard mask) during an etching process, an implant mask during an ion implantation process, or a mask during a deposition process to form a patterned material layer. Thereafter, the patterned recording medium is removed from the workpiece, for example, by a resist stripping process.

Electron beam lithography is particularly useful as IC technologies progress towards smaller feature sizes, such as 32 nanometers, 28 nanometers, 20 nanometers, and below. However, its usefulness is limited by throughput, which generally refers to an amount of time an electron beam lithography system takes to expose an entire workpiece (wafer). The present disclosure uses backscattered energy, which is typically viewed as a disadvantage in electron beam lithography, to improve throughput. Electron beam lithography techniques disclosed herein increase pattern density of an IC design layout to increase backscattered energy and thereby reduce a maximum exposure dose needed for proximity effect correction (which is used to compensate for a lack of backscattered energy as pattern density decreases and provide uniformity in a maximum energy absorbed for all pattern densities of the IC design layout). Reducing the maximum exposure dose needed for proximity effect correction reduces a maximum exposure dose implemented during an electron beam exposure, allowing an increase in scanning speed. Different embodiments may have different advantages, and no particular advantage is necessarily required of any embodiment.

FIG. 1 is a simplified diagrammatic view of an electron beam system 100 according to various aspects of the present disclosure. Electron beam system 100 can implement methods described herein to write a pattern, such as an IC pattern, on a workpiece 102. Workpiece 102 includes a substrate (for example, a semiconductor substrate), a reticle (also referred to as a photomask or a mask), or any base material on which processing is conducted to produce layers of material configured to form IC patterns and/or IC features. In the depicted embodiment, a recording medium 104, such as an energy sensitive resist layer, is disposed on workpiece 102. Electron beam system 100 writes a pattern into recording medium 104, which is subsequently transferred to workpiece 102. FIG. 1 has been simplified for the sake of clarity to better understand the inventive concepts of the present disclosure. Additional features can be added in electron beam system 100, and some of the features described below can be modified, replaced, or eliminated for additional embodiments of electron beam system 100.

In the depicted embodiment, electron beam system 100 includes an electron beam data processing unit (DPU) 106 and an electron beam exposure unit (EXU) 108. DPU 106 is communicatively coupled with EXU 108 via communications link 110, such that DPU 106 and EXU 108 can communicate with one another. DPU 106 is configured to read patterning data from a data storage medium (for example, a non-volatile data storage medium), which may be within DPU 106, or remotely positioned and in communication with DPU 106. DPU 106 includes a memory 112, where DPU 106 loads patterning data obtained from the data storage memory into memory 112. In some implementations, the patterning data includes a pattern layout, such as an IC design layout, and/or dosage assignments corresponding with the pattern layout. DPU 106 includes a pattern generator that processes the patterning data and generates a pattern writing instruction set, for example, a pattern writing instruction set associated with the pattern layout. DPU 106 sends the pattern writing instruction set to EXU 108, which controls and configures various components of EXU 108 to write the pattern corresponding with the pattern writing instruction set on workpiece 102. As described herein, DPU 106 is configured to generate pattern writing instructions that improve throughput, such that the pattern generator can process patterning data and generate a pattern writing instruction set that can be implemented by EXU 108 to decrease an amount of time required for exposing an entirety of workpiece 102 while maintaining enhanced image contrast.

EXU 108 includes an electron beam source 114 for generating an electron beam 116. In some implementations, electron beam system 100 is an e-beam direct write (EBDW) system manufactured by IMS Nanofabrication AG (Vienna, Austria), KLA-Tencor Corp. (Milpitas, Calif.), or Leica Microsystems gmbH (Jenna, Germany). In some implementations, electron beam source 114 is an electron gun with an electron generating mechanism (for example, thermal electron emission). In a particular example, the electron gun includes a tungsten (or other suitable material) filament designed and biased to thermally emit electrons. Electron beam 116 is focused to be incident on a multi-beam mechanism 118 (such as a stencil plate), which generates a plurality of electron beams 120 from electron beam 116. For example, multi-beam mechanism 118 includes an aperture array for defining a shape and/or a distribution of electron beam 116. The aperture array can include various openings configured to generate an array of electron beams 120. In some implementations, electron beam 116 is incident on the aperture array as a large charged particle beam spot with a uniform space distribution, where the aperture array splits electron beam 116 into electron beams 120. In some implementations, the aperture array includes tunable openings, such that a size, shape, location, and/or other opening characteristic can be modified to achieve desired distribution of electron beams 120. The openings may be dynamically tunable over time. The number of electron beams 120 may vary depending on requirements of electron beam system 100, an electron beam lithography process, and/or an IC pattern to be formed on workpiece 102. In some implementations, as described further below, electron beams 120 are Gaussian beams (for example, circular beams having Gaussian current intensity distributions) scanned across workpiece 102 in a raster mode. In some implementations, electron beam system 100 includes an imaging component (not shown), such as various electrostatic lenses and/or electromagnetic lenses, that focuses electron beam 116 onto multi-beam mechanism 118.

EXU 108 further includes an electron beam controller 122 that controls a shape and/or a distribution of electron beams 120 on workpiece 102 (in particular, on recording medium 104). In some implementations, an imaging component 124 (for example, an optical system that includes various electrostatic lenses and/or electromagnetic lenses) focuses electron beams 120 passing through electron beam controller 122 onto workpiece 102 to achieve desired imaging effect. Electron beam controller 122 includes a blanking system for turning electron beams 120 on or off (generally referred to as blanking), a deflection system for scanning electron beams 120 across workpiece 102 (for example, in a vector scan mode or a raster scan mode), and any other charged particle beam system components necessary to achieve desired distribution of electron beams 120 on workpiece 102. In some implementations, the blanking system includes at least one blanker and at least one aperture. For example, the blanker can include an electrostatic deflector (for example, a set of electrode plates) controlled by control signals (for example, electrical control signals) associated with pattern writing instructions received from DPU 106. When the electrostatic deflector is energized (for example, when a voltage is applied across the set of electrode plates), the blanker blocks electron beams 120 from passing through to workpiece 102 (for example, by sweeping charged particle beams off axis via an electrical field until the charged particle beam is intercepted by a downstream aperture). When the electrostatic deflector is not energized, the blanker allows electron beams 120 to pass through and expose a portion of workpiece 102. In some implementations, the blanking system can individually blank each electron beam 120. In some implementations, the deflection system includes a scanner that magnetically (for example, using conductive coils) or electrostatically (for example, using conductive plates) deflects electron beams 120 in two orthogonal directions, such that electron beams 120 are scanned over a surface of workpiece 100. In some implementations, the deflection system can individually deflect each electron beam 120. In some implementations, the deflection system includes a grid deflection system configured to deflect electron beams 120 across at least one pixel of an exposure grid. For example, the deflection system includes a grid deflection system disposed between imaging component 124 and workpiece 102, which can individually deflect each electron beam 120, such that the grid deflection system can deflect one of electron beams 120 to a desired landing position on workpiece 102. In some implementations, electron beam controller 122 blanks a portion of electron beams 120, such that the grid deflection system receives a remaining portion of electron beams 120, which can be deflected. In some implementations, the blanking system and the deflection system are integrated into a single module configured to blank and/or deflect electron beams 120.

A control module 126 is integrated and communicatively coupled with various components of electron beam lithography system 100. In the depicted embodiment, control module 126 is communicatively coupled to DPU 106 and electron beam controller 122. Control module 126 sends electrical control signals via a communications link 128 to electron beam controller 122 and/or electrical control signals via a communications link to the grid deflection system based on pattern writing instruction sets received from DPU 106, such that electron beam controller 122 configures the blanking system, the deflection system, and other components based on the electrical control signals received from control module 126.

A stage 130 holds and secures workpiece 102 thereon, for example, using a vacuum system and/or other suitable securing mechanism. During processing, stage 130 moves in various directions (depicted by arrow 132), such that electron beams 120 are incident on recording medium 104 on workpiece 102. Stage 130 and electron beam controller 122 (in particular, the blanking system and the deflection system) are configured to coordinately scan electron beams 120 across workpiece 102. Electron beams 120 are focused (for example, by imaging component 124) onto recording medium 104, such that a target pattern (for example, defined by the IC design layout) is written directly into recording medium 104 without using a reticle. After workpiece 102 has been scanned, a developing process is performed to remove exposed (or non-exposed) portions of recording medium 104, thereby forming a pattern in recording medium 104 that can be transferred to workpiece 102. For example, patterned recording medium 104 is used as an etch mask during a subsequent etching process, an implant mask during an ion implantation process, or a mask during a deposition process to form a patterned material layer of workpiece 102. The present disclosure contemplates that electron beam system 100 may include other components, such as an alignment system and/or a collimator. However, as noted above, electron beam system 100 is simplified for a better understanding of embodiments disclosed herein.

Figure 2:
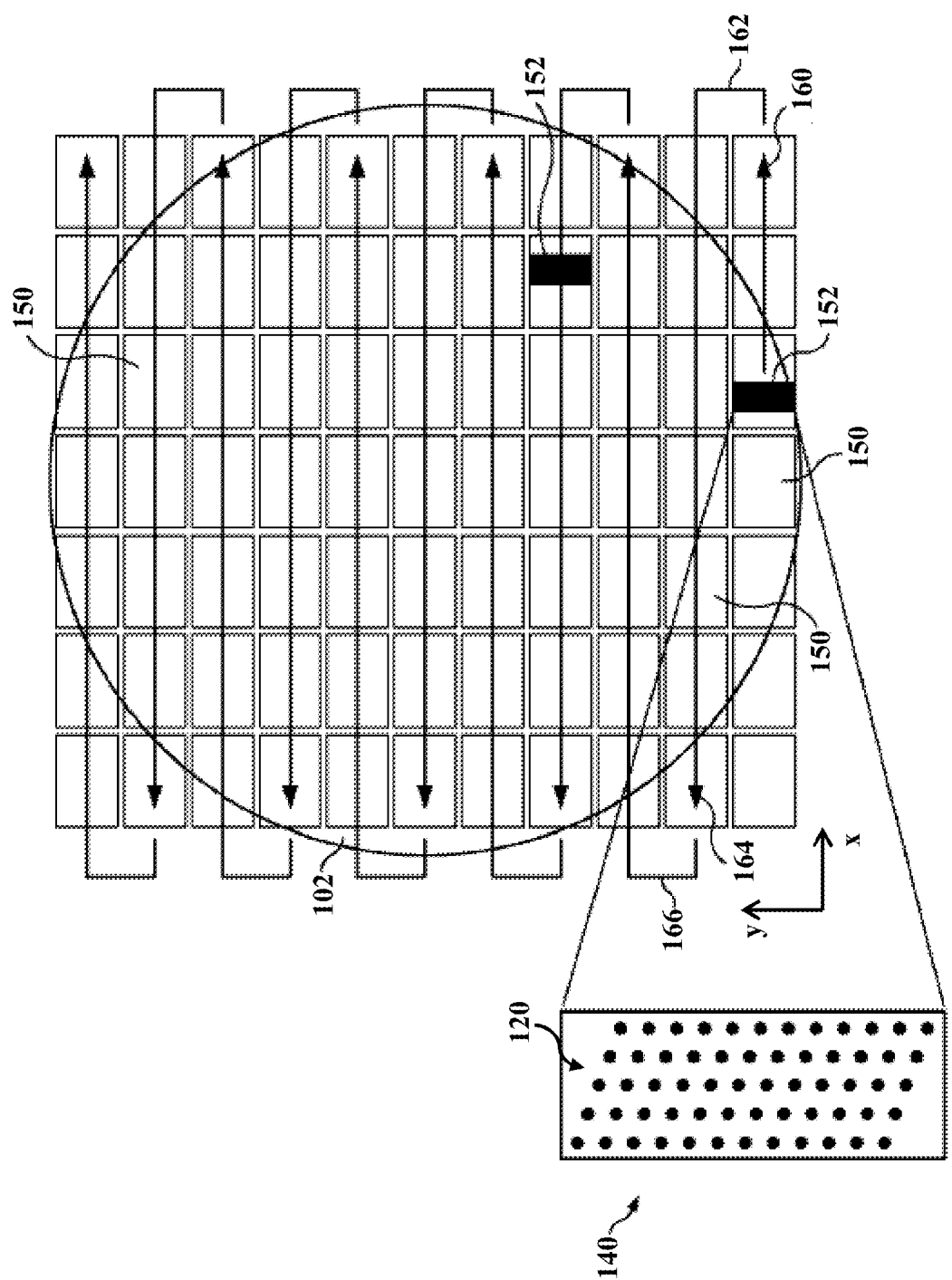
FIG. 2 is a simplified top view of a workpiece when raster scanning is implemented to perform an electron beam lithography process, such as that implemented by the electron beam system of FIG. 1, according to various aspects of the present disclosure.

Electron beam system 100 can implement vector scanning or raster scanning. For purposes of the following disclosure, electron beam system 100 is configured as a raster scan system (often referred to as a raster writer). FIG. 2 is a simplified diagrammatic top view of a workpiece, such as workpiece 102, when raster scanning is implemented for performing an electron beam lithography process according to various aspects of the present disclosure. In FIG. 2, an electron beam system, such as electron beam system 100, scans workpiece 102 with electron beams 120 (collectively referred to as an electron beam 140) along a scan direction. For example, in the depicted embodiment, electron beam 140 is scanned across workpiece 102 in an x-direction. Workpiece 102 is divided into exposure fields 150, each of which defines an area of workpiece 102 to be exposed by electron beam 140. During the electron beam lithography process, an IC pattern is transferred to workpiece 102 at locations (areas) corresponding with exposure fields 150. In some implementations, each exposure field 150 defines an area for forming at least one IC die, which is repeated over workpiece 102. In some implementations, exposure fields 150 define a maximum area that electron beam 140 can write without moving stage 130. In some implementations, each exposure field 150 is further divided into exposure sub-fields 152 of any suitable size, where exposure sub-fields 152 define an exposure area to which electron beam 140 will be confined during each exposure.

During raster scanning, electron beam system 100 scans electron beam 140 line by line across workpiece 102, blanking and/or deflecting electron beam 140 as required by an exposure map defined by a pattern writing instruction set (for example, generated by DPU 106), such that an entirety of workpiece 102 is scanned and directly written to by electron beam 140. For example, in the depicted embodiment, workpiece 102 moves (via stage 130) in a direction 160 along the x-direction, and the writing instructions (for example, blanking instructions and/or deflection instructions) control electron beam 140 to write a desired IC pattern to each exposure field 150. For a particular exposure field 150, electron beam system 100 positions charged particle beam at locations of the particular exposure field 150 that correspond with each pixel defined in the exposure map. When electron beam 140 approaches an edge of workpiece 102, stage 130 continues to move until electron beam 140 scans beyond an edge of workpiece 102 a sufficient distance to facilitate a change in a direction 162, such as along the y-direction, to another row of exposure fields 150. Workpiece 102 is then moved in a direction 164 along the x-direction (opposite from direction 160) during exposure until electron beam 140 again reaches an edge of workpiece 102 and workpiece 102 is moved in a direction 166, such as along the y-direction, to position electron beam 140 along another row of exposure fields 150. Electron beam system 100 can repeat this process until the desired IC pattern is written in each exposure field 150 defined on workpiece 102. FIG. 2 has been simplified for the sake of clarity to better understand the inventive concepts of the present disclosure.

Resolution of electron beam system 100 is limited by proximity effects, which result from electrons scattering as incident electron beam 140 passes through recording medium 104, such that a total exposure dosage absorbed by a particular exposed region of recording medium 104 varies from a defined exposure dosage for the particular exposed region. For example, a given exposed region of recording medium 104 integrates all electron energy to which it is exposed—(1) directly incident electron beam energy (referred to as "forward scattered" energy, incident dosage, or forward dosage) and (2) backscattered electron beam energy that results from forward dosage to the exposed region and/or forward dosage to a neighboring exposed region (referred to as "backscattered" energy or backscattered dosage). Thus, a total energy absorbed by the given exposed region is not only a function of the forward dosage intentionally delivered to that exposed region, but also a function of the backscattered dosage unintentionally delivered to that exposed region. Such phenomenon is outlined in U.S. Pat. No. 4,463,265.

Figure 3:
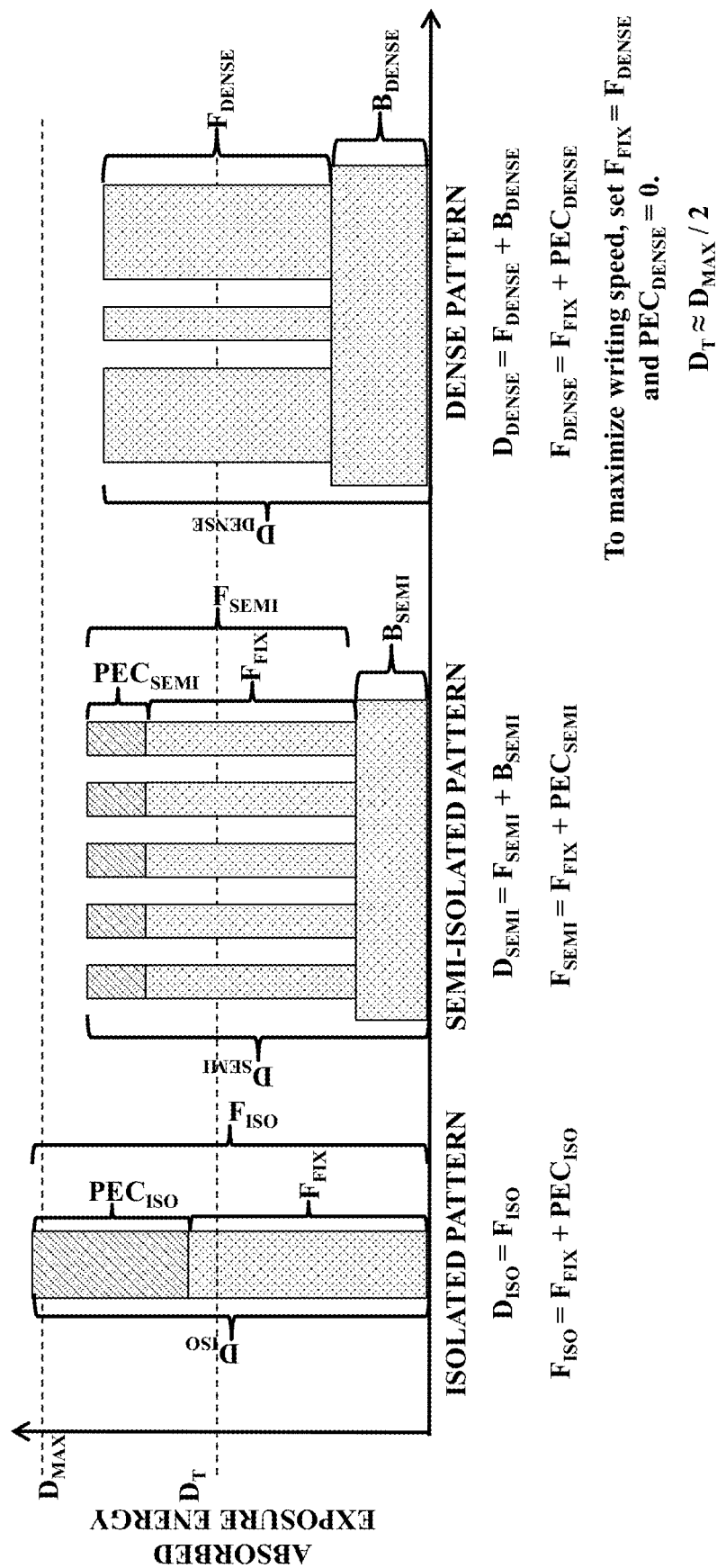
FIG. 3 depicts energy absorbed by a recording medium as a function of pattern density of a pattern area being written to the recording medium according to various aspects of the present disclosure.

Further, since the backscattered energy varies with pattern density in a particular region of the target pattern being written to recording medium 104, the total energy absorbed by the given exposed region also varies with pattern density. For example, FIG. 3 depicts energy absorbed by a recording medium as a function of pattern density of a pattern area being written to the recording medium according to various aspects of the present disclosure. In FIG. 3, a threshold energy dose ($D_T$) indicates an amount of electron beam energy required to cause chemical change in an exposed region of the recording medium, such that the exposed region becomes soluble (or insoluble) to a developer, and a maximum energy dose ($D_{MAX}$) (or desired energy dose) indicates an amount of electron beam energy required to cause chemical change in the exposed region to achieve maximum image contrast without backscattered dosage. Since backscattering increases with pattern density, a total energy absorbed by the recording medium when writing a dense pattern is greater than a total energy absorbed by the recording medium when writing an isolated pattern using the same input dosage. For example, for the dense pattern, the total energy absorbed by the recording medium includes energy absorbed from forward dosage $F_{DENSE}$ and energy absorbed from backward dosage $B_{DENSE}$, such that the total energy absorbed by the recording medium achieves best image contrast when exposed with a dense input dosage $D_{DENSE}$. In contrast, for the isolated pattern, a total energy absorbed by the recording medium includes energy absorbed from forward dosage $F_{ISO}$ but no (or minimal) energy absorbed from backward dosage $B_{ISO}$, such that the total energy absorbed by the recording medium achieves best image contrast when exposed with an isolated input dosage $D_{ISO}$. Often, $D_{ISO}$ is equivalent to $D_{MAX}$ for raster multiple electron beam writers. For a semi-isolated pattern that produces less backscattering energy during exposure than the dense pattern, total energy absorbed by the recording medium includes energy absorbed from forward dosage $F_{SEMI}$ and less energy absorbed from backward dosage $B_{SEMI}$ (when compared to energy absorbed from backward dosage $B_{DENSE}$), such that the total energy absorbed by the recording medium achieves best image contrast when exposed with a semi-isolated input dosage $D_{SEMI}$, which typically falls between $D_{ISO}$ and $D_{DENSE}$ (in other words, $D_{ISO} \geq D_{SEMI} \leq D_{DENSE}$). To compensate for such variances and ensure that the total energy absorbed by the recording medium is the same for all pattern densities, proximity effect correction (PEC) is applied to the forward dosage for pattern areas having lower pattern densities.

To determine respective PEC, a relative amount of energy absorbed in the recording medium due to backscattering depends on a backscattering ratio η:

$$B = \eta * I_b$$

where B is a backscattering energy intensity, η is greater than or equal to zero (η≥0), and $I_b$ is a convolution of forward scattered energy distribution and backscattered energy distribution. Maximum backscattering energy intensity occurs in a pattern area having a pattern density of 100% (D100), such that B can be given by:

$$B = \eta F,$$

where F is a forward dosage (energy). To optimize image contrast at $D_T$, modulating the forward scattered energy can modulate the forward dosage, as given by:

$$D_T = F + B = (F_{PEC}/2) + B,$$

where $F_{PEC}$ is the modulated forward scattered energy. $F_{PEC}$ is thus given by:

$$F_{PEC} = D_T / [(1/2) + \eta].$$

If $D_T$ is defined as 50% of forward dosage for a fully isolated pattern (D0), $F_{PEC}$ is given by:

$$F_{PEC} = F_{ISO}/(1+2\eta).$$

For patterns with 50% density (D50), $F_{PEC}$ is given by:

$$F_{PEC} = F_{ISO}/(1+\eta),$$

where $D_T$ is given by:

$$D_T = F + B = (F_{PEC}/2) + (0.5\eta F_{PEC}).$$

Accordingly, electron beam system 100 can be configured to modulate $F_{PEC}$ to reach $D_T$ to ensure that recording medium 104 absorbs the same total amount of energy for all pattern densities (here, isolated, semi-isolated, and dense patterns).

However, usefulness of electron beam system 100 is limited by its throughput (an amount of time taken to expose an entirety of workpiece 102). A total write time (TWT) for electron beam system 100 in raster scan mode is approximately given by:

$$TWT \approx D_M/(J_M) + t_0$$

where $D_M$ is a maximum exposure dose needed for a particular recording medium in microcoulombs per square centimeter (μC/cm²), $J_M$ is a maximum current density that can be provided to an exposure tool in amperes per square meter (A/m²), and to is overhead time (including, for example, time associated with stage movement and/or electron beam drift correction). TWT is thus proportional to $D_M$ and inversely proportional to $J_M$, where throughput of electron beam system 100 is largely dependent on $D_M$ and $J_M$ and slightly dependent on complexity of a target pattern (such as polygon numbers or polygon shapes). Since, as detailed above, exposure dose increases as pattern density decreases, $D_M$ is equivalent to $D_T$ plus a maximum PEC required for ensuring that a recording medium absorbs the same amount of electron beam energy for all pattern densities. Therefore, as the maximum PEC increases, $D_M$ increases and throughput decreases. The following discussion proposes techniques for reducing the maximum PEC, thereby decreasing $D_M$ and increasing throughput.

Figure 4:
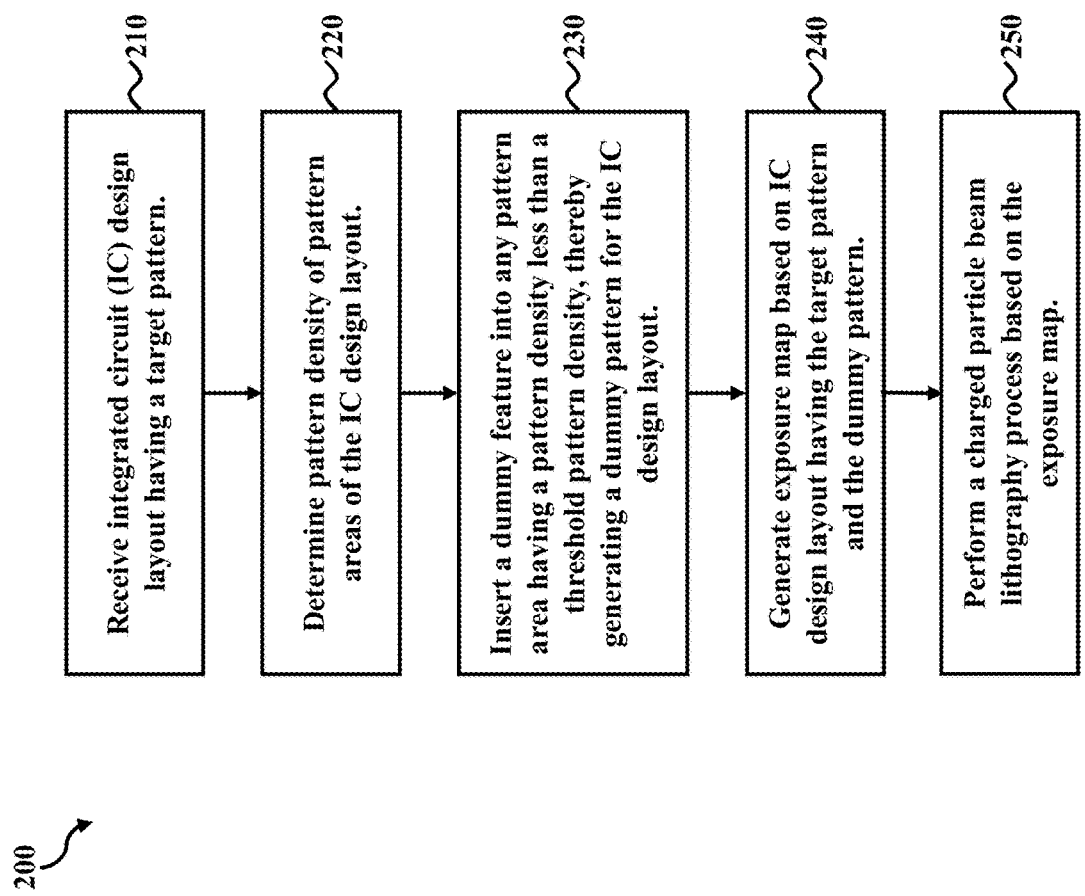
FIG. 4 is a flow chart of lithography method that can be implemented by a lithography system, such as the electron beam system of FIG. 1, according to various aspects of the present disclosure.

FIG. 4 is a flow chart of a lithography method 200, such as an electron beam lithography method, according to various aspects of the present disclosure. In some implementations, electron beam system 100 implements lithography method 200 to directly write a target pattern, such as an IC pattern, on a workpiece, such as workpiece 102, having a recording medium, such as recording medium 104, formed thereon. In some implementations, DPU 106 and/or EXU 108 perform various steps of lithography method 200. Lithography method 200 can be implemented by electron beam system 100 to write IC patterns with improved throughput. For example, by increasing an overall pattern density of the IC patterns, method 200 decreases a maximum exposure dose (in particular, a maximum PEC dose) needed for writing the IC patterns, allowing faster stage scan speeds when writing the IC patterns. FIG. 4 has been simplified for the sake of clarity to better understand the inventive concepts of the present disclosure. Additional steps can be provided before, during, and after lithography method 200, and some of the steps described can be modified, replaced, or eliminated for other embodiments of lithography method 200.

At block 210, an IC design layout having a target pattern is received, for example, to be formed on a workpiece, such as workpiece 102, by a lithography system, such as electron beam system 100. In some implementations, DPU 106 receives the IC design layout from a design house. The IC design layout is presented in one or more data files having information of the target pattern. For example, the IC design layout is received in a Graphic Database System file format (such as GDS or GDSII), an Open Artwork System Interchange Standard file format (such as OASIS or OAS), or other suitable file format. The IC design layout includes various circuit patterns (represented by geometrical shapes) designed for an IC product based on specifications of an IC product to be manufactured. The circuit patterns correspond to geometrical patterns formed in various material layers (such as metal layers, dielectric layers, and/or semiconductor layers) that combine to form IC features of the IC product, such as that to be fabricated on workpiece 102. For example, FIG. 5 is a simplified diagrammatic view of an IC design layout 300 according to various aspects of the present disclosure. IC design layout 300 includes a target pattern defined by various geometrical patterns that represent IC features (also referred to as main features). IC features constitute a portion of an IC device that is to be formed or defined in a substrate (for example, a silicon substrate) and/or in various material layers disposed on the substrate. IC features represent active regions/features, gate features (for example, gate electrodes), source regions/features, drain regions/features, interconnection features (for example, contacts, vias, and/or metal lines of a multi-layer interconnect structure), bonding pad features, other IC features, or combinations thereof. In some implementations, IC design layout 300 includes assist features for providing imaging effects, process enhancements, and/or identification information. In FIG. 5, IC design layout 300 is divided into various pattern areas 302, each of which can include one or more IC features or one or more portions of IC features (though some pattern areas may include no IC features). In the depicted embodiment, pattern areas 302 are defined having substantially the same shapes, sizes, and/or areas, though the present disclosure contemplates implementations where pattern areas 302 have different shapes, sizes, and/or areas. FIG. 5 has been simplified for the sake of clarity to better understand the inventive concepts of the present disclosure. Additional features can be added in IC design layout 300, and some of the features described above can be modified, replaced, or eliminated for additional embodiments of IC design layout 300.

Turning again to FIG. 4, at block 220, method 200 determines a pattern density of each pattern area of the IC design layout, such as each pattern area 302 of IC design layout 300. For example, FIG. 6 is a simplified diagrammatic view of an exemplary pattern area 302A of IC design layout 300 according to various aspects of the present disclosure. Pattern area 302A includes an IC feature 304 and a background area 306, which is a portion of pattern area 302A that is free of IC features, dummy features, and/or any other pattern features. A pattern density (PD) of pattern area 302A is defined as:

$$PD=(A_T+A_D+A_O)/A_P,$$

where $A_T$ is a total area of main features (in other words, a total area of all IC features of the target pattern in pattern area 302A), $A_D$ is a total area of dummy features (in other words, a total area of all dummy features of a dummy pattern in pattern area 302A), $A_O$ is a total area of any other pattern features (in other words, a total area of all other features in pattern area 302A), and $A_P$ is a total area of pattern area 302A. In the depicted embodiment, assuming pattern area 302A has a length and a width of about 10 µm, and IC feature 304 (the only feature of the target pattern residing in pattern area 302A) has a length of about 8 µm and a width of about 2.5 the overall pattern density for pattern area 302A is about 0.2 (or 20%):

$$PD = (A_T + A_D)/A_P = ((8 \text{ µm} \times 2.5 \text{ µm}) + 0 \text{ µm}^2))/ \qquad 1$$
$$(10 \text{ µm} \times 10 \text{ µm}) = 0.2.$$

Pattern area 302A is thus referred to as an isolated pattern, which generally refers to pattern areas having an overall pattern density of less than about 0.25 (for example, about 0.1 to about 0.2). In some implementations, pattern areas having an overall pattern density that is greater than or equal to about 0.25 (or 25%) and less than about 0.40 (or 40%) can be referred to as semi-isolated patterns, and pattern areas having an overall pattern density that is greater than or equal to about 0.40 (or 40%) (for example, about 0.4 to about 0.5) can be referred to as dense patterns. In some implementations, isolated patterns, semi-isolated patterns, and/or dense patterns are defined with different overall pattern densities.

At block 230, a dummy feature is inserted into any pattern area having a pattern density that is less than a threshold pattern density ($PD_{TH}$), thereby generating a dummy pattern for the IC design layout. For a given pattern area, the inserted dummy feature is configured to increase the pattern density of the given pattern area, such that the pattern density is greater than or equal to $PD_{TH}$. $PD_{TH}$ is a pattern density that needs a level of PEC that an electron beam system can implement without exceeding a maximum exposure dosage limit of the electron beam system while maximizing throughput. In some implementations, $PD_{TH}$ is 25%, where pattern densities less than 25% need levels of PEC that would require the electron beam system to implement a $D_M$ (which would be given by $D_T$+a maximum PEC required for pattern densities less than 25%) that exceeds a maximum dosage limit of the electron beam system. In the present disclosure, inserting a dummy feature into a pattern area having an isolated pattern increases the pattern density (for example, to $PD_{TH}$), thereby increasing backward scattering energy absorbed by the recording medium during writing and decreasing an exposure energy needed for writing the isolated pattern. For example, increasing a pattern density of the pattern area from 0% (PD0) to 50% (PD50) decreases an exposure dose for the pattern area—in particular, from D0 to D50. Inserting dummy features into pattern areas having isolated patterns decreases a maximum PEC dosage needed by the electron beam system for exposing such pattern areas, such that a maximum PEC dosage needed for achieving absorption of the same amount of electron beam energy for all pattern areas 302 when writing the target pattern and the dummy pattern of IC design layout 300 is less than a maximum PEC dosage needed for achieving absorption of the same amount of electron beam energy for all pattern areas 302 when writing only the target pattern of IC design layout 300 (in other words, a maximum PEC dosage required for implementation by the electron beam system when writing IC design layout 300 is reduced from a PEC required for writing patterns having a minimum pattern density of IC design layout 300 to a PEC required for writing patterns having a threshold pattern density, which is greater than the minimum pattern density). Accordingly, a scan speed of electron beam system 100 can be increased when IC design layout 300 includes the dummy pattern, which ensures that each pattern area has a pattern density greater than or equal to $PD_{TH}$.

In some implementations, and returning briefly to FIG. 3, the electron beam system can be configured to provide a forward dosage FED (plus any PEC that is required for reaching $D_T$ and/or a dosage for achieving best image contrast of a given pattern. Since dense patterns absorb forward scattered energy and back scattered energy, and often, no PEC is necessary for dense input dosage $D_{DENSE}$ to reach $D_T$ and/or the dosage for achieving best image contrast (in other words, $PEC_{DENSE}=0$), dense input dosage $D_{DENSE}$ can be given by:

$$D_{DENSE} = F_{DENSE} + B_{DENSE}$$
$$= (F_{FIX} + PEC_{DENSE}) + B_{DENSE}$$
$$= F_{FIX} + B_{DENSE}.$$

Accordingly, to maximize writing speed when forming an IC pattern that includes different density patterns (isolated patterns, dense patterns, and semi-isolated patterns), $F_{FIX}=F_{DENSE}$, and PEC for semi-isolated patterns and isolated patterns, can be determined based on forward dosage $F_{FIX}$, as given by:

$$F_{SEMI}=F_{FIX}+PEC_{SEMI}, \text{ and}$$

$$F_{ISO}=F_{FIX}+PEC_{ISO}$$

Since semi-isolated patterns absorb forward scattered energy and backscattered energy (which is typically less than backscattered energy absorbed by dense patterns) and isolated patterns absorb forward scattered energy, semi input dosage $D_{SEMI}$ and isolated input dosage $D_{ISO}$ for reaching $D_T$ and/or the dosage that achieves best image contrast can be given by:

$$D_{SEMI} = F_{SEMI} + B_{SEMI}$$
$$= (F_{FIX} + PEC_{SEMI}) + B_{SEMI}, \text{ and}$$
$$D_{ISO} = F_{ISO} = F_{FIX} + PEC_{ISO},$$

such that the electron beam system 100 applies $PEC_{SEMI}$ to $F_{FIX}$ and $B_{SEMI}$ to reach $D_{SEMI}$, and $PEC_{ISO}$ to $F_{FIX}$ to reach $D_{ISO}$. Considering pattern area 302A, where $PD_{TH}$ is 25% and PD is 20%, pattern area 302A has a pattern density that is less than $PD_{TH}$ (in other words, $PD<PD_{TH}$) and can be classified as an isolated pattern, such that $D_{ISO}=F_{ISO}=F_{FIX}+PEC_{ISO}$. FIG. 6B depicts energy absorbed by a recording medium when written with the pattern depicted in FIG. 6A along line B-B according to various aspects of the present disclosure. However, as noted above, $PEC_{ISO}$ needed for reaching $D_{ISO}$ may require a $D_M$ that exceeds the electron beam system's maximum exposure dosage limit and/or a $D_M$ that decreases throughput.

The present disclosure thus inserts dummy patterns into IC design layout 300 to increase pattern density, thereby limiting a maximum PEC necessary for reaching $D_T$ to a PEC for $PD_{TH}$. In some implementations, $D_M$ of the electron beam system is limited to $F_{FIX}$ plus a PEC dosage for $PD_{TH}$, where PEC for $PD_{TH}$ is less than $PEC_{ISO}$. Turing again to FIG. 4, method 200 proceeds to insert one or more dummy features into pattern area 302A. For example, in FIGS. 7A-10A, pattern area 302A has been modified with a dummy pattern that increases a pattern density of pattern area 302A to greater than or equal to $PD_{TH}$ (here, 25%). FIGS. 7A-10A are simplified diagrammatic views of pattern area 302A after dummy insertion according to various aspects of the present disclosure. FIGS. 7B-10B depict energy absorbed by a recording medium when written with patterns depicted in FIGS. 7A-10A (here, including a main pattern and a dummy pattern) along line B-B according to various aspects of the present disclosure.

In FIG. 7A, the dummy pattern includes dummy features 310, which are full size assistant features (FSAFs), that achieve a semi-isolated pattern density in pattern area 302A, such that a pattern of pattern area 302A (including the target pattern and the dummy pattern) can be referred to as a semi-isolated pattern. FSAFs are features having a dimension (for example, a length and/or a width) that is greater than a resolution of a lithography system, such as an electron beam system. FSAFs are thus printable features, meaning dummy features 310 will be written onto a recording medium during an electron beam lithography process. In the depicted embodiment, dummy features 310 are substantially the same size as IC feature 304 (for example, having the same length and the same width). In some implementations, a size and/or a shape of dummy features 310 is different than a size and/or a shape of IC feature 304. In some implementations, dummy features 310 are oriented relative to IC feature 304 differently than depicted. Turning to FIG. 7B, since dummy features 310 contribute backscattering energy to IC feature 304 during an electron beam lithography process, an input dosage for achieving best image contrast when writing IC feature 304 based on modified IC design layout 300 (incorporating dummy features 310), is determined based on characteristics of semi-isolated patterns, instead of characteristics of isolated patterns, such that an input dosage $D_{SEMI}$ for modified IC design layout 300 in FIGS. 7A, 7B depends on forward dosage $F_{SEMI}$ and backward dosage $B_{SEMI}$ (in other words, $D_{SEMI}=F_{SEMI}+B_{SEMI}=(F_{FIX}+PEC_{SEMI}) B_{SEMI}$). Since $PEC_{SEMI}$ is applied to reach $D_{SEMI}$, instead of $PEC_{ISO}$, a total exposure dosage provided by the electron beam system for writing IC feature 304 based on modified IC design layout 300 that incorporates dummy features 310 (here, $F_{SEMI}=F_{FIX}+PEC_{SEMI}$) is less than a total exposure dosage provided by the electron beam system for writing IC feature 304 based on IC design layout 300 received at block 210 (here, $F_{ISO}=F_{FIX}+PEC_{ISO}$, where $PEC_{ISO}>PEC_{SEMI}$).

In FIG. 8A, the dummy pattern includes an array of dummy features 312, which are sub-resolution assistant features (SRAFs), that achieve a dense pattern density in pattern area 302A, such that a pattern of pattern area 302A (including the target pattern and the dummy pattern) can be referred to as a dense pattern. SRAFs are features having a dimension (for example, a length and/or a width) that is less than a resolution of a lithography system, such as an electron beam system. SRAFs are thus non-printable features, meaning dummy features 312 will not be written onto a recording medium during an electron beam lithography process. In some implementations, SRAFs have a dimension that is less than or equal to about 6 nm (for example, about 1 nm). In the depicted embodiment, dummy features 312 are substantially the same size and have a length and/or a width that is smaller than the resolution of electron beam system 100. In some implementations, dummy features 312 have different sizes, shapes, and/or orientations relative to IC feature 304. Turning to FIG. 8B, since dummy features 312 contribute backscattering energy to IC feature 304 during an electron beam lithography process, an input dosage for achieving best image contrast when writing IC feature 304 based on modified IC design layout 300 (incorporating dummy features 312), is determined based on characteristics of dense patterns, instead of characteristics of isolated patterns, such that an input dosage $D_{DENSE}$ for modified IC design layout 300 in FIGS. 8A, 8B depends on forward dosage $F_{DENSE}$ and backward dosage $B_{DENSE}$ (in other words, $D_{DENSE}=F_{DENSE}+B_{DENSE}=(F_{FIX}+PEC_{DENSE})+B_{DENSE}$). Since $PEC_{DENSE}$ (which, in some implementations, may be 0) is applied to reach $D_{DENSE}$, instead of $PEC_{ISO}$, a total exposure dosage provided by the electron beam system for writing IC feature 304 based on modified IC design layout 300 that incorporates dummy features 312 (here, $F_{DENSE}=F_{FIX}+PEC_{DENSE}$) is less than a total exposure dosage provided by the electron beam system for writing IC feature 304 based on IC design layout 300 received at block 210 (here, $F_{ISO}=F_{FIX}+PEC_{ISO}$, where $PEC_{ISO}>PEC_{DENSE}$).

Figure 9A:
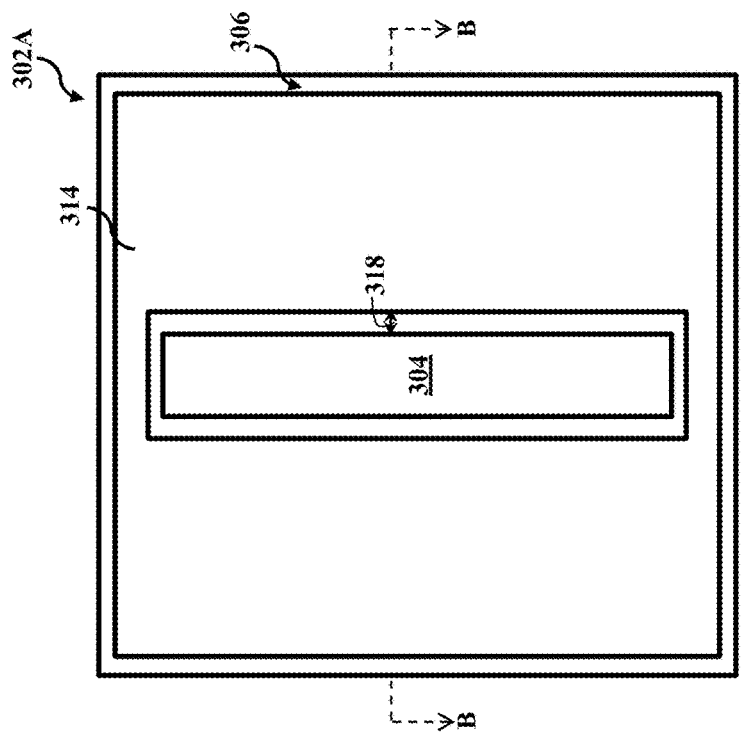
Figure 9B:
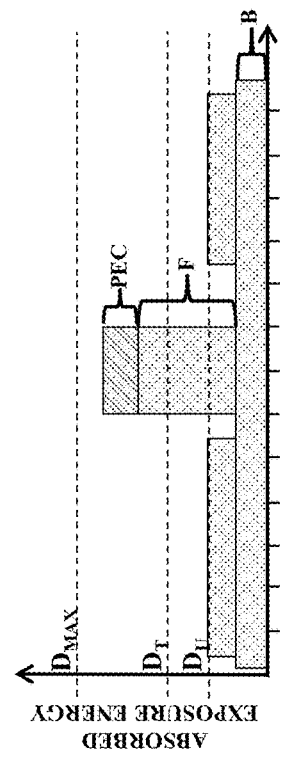
Figure 10A:
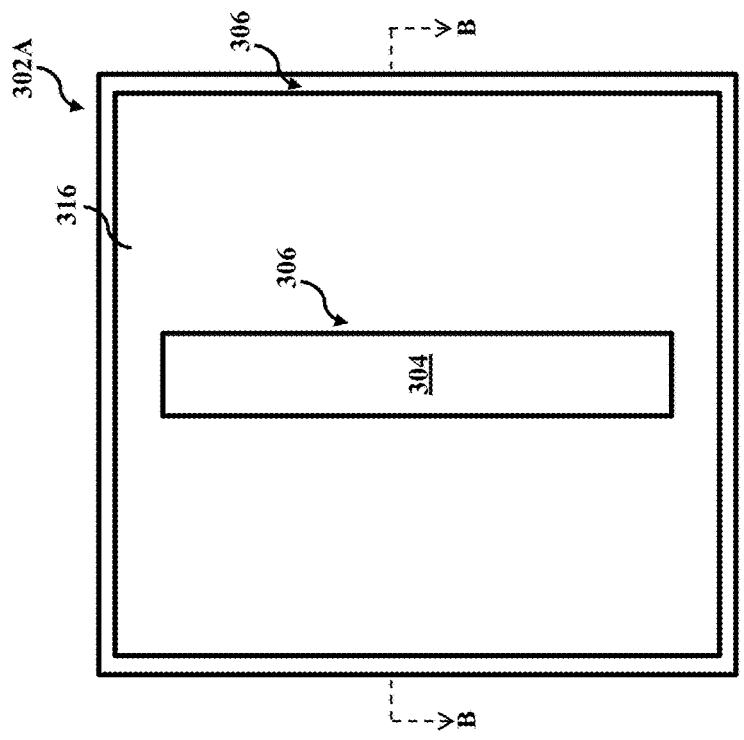
Figure 10B:
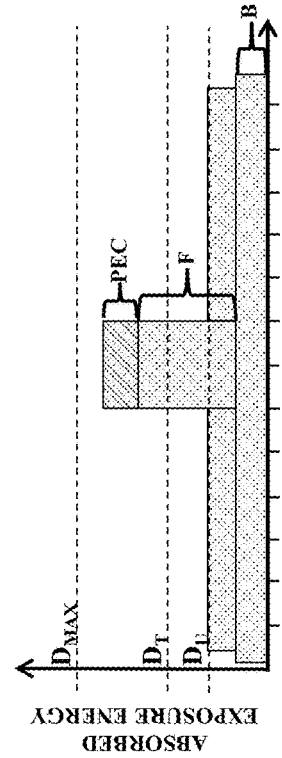

In FIG. 9A and FIG. 10A, the dummy pattern includes a dummy feature 314 and a dummy feature 316, respectively, which are under-threshold assistant features (UTAFs). UTAFs are features assigned an exposure dose that is less than $D_T$. For example, dummy feature 314 and dummy feature 316 are assigned an underexposure dose ($D_U$) that is 75% of $D_T$ (in other words, $D_U=0.75 \times D_T$). UTAFs are non-printable features that can contribute backscattering energy when writing IC feature 304 (a portion of the main pattern). In FIG. 9A, dummy feature 314 is positioned relative to IC feature 304, such that a gap 318 (also referred to as a space) is disposed between dummy feature 314 and IC feature 304. Gap 318 can define an area around IC feature 304 that ensures sufficient image contrast. In FIG. 10A, no gap is disposed between dummy feature 316 and IC feature 304, such that dummy feature 316 may overlap with IC feature 304. Turning to FIG. 9B, since dummy feature 314 contributes backscattering energy to IC feature 304 during an electron beam lithography process, PEC applied to a forward exposure dosage F reach $D_T$ when writing IC feature 304 based on modified IC design layout 300 (incorporating dummy feature 314) is less than PEC applied to the forward exposure dosage F to reach $D_T$ when writing IC feature 304 based on IC design layout 300 received at block 210. Similarly, turning to FIG. 10B, since dummy feature 316 contributes backscattering energy to IC feature 304 during an electron beam lithography process, PEC applied to a forward exposure dosage F to reach $D_T$ when writing IC feature 304 based on modified IC design layout 300 (incorporating dummy feature 316) is less than PEC applied to the forward exposure dosage to reach $D_T$ when writing IC feature 304 based on IC design layout 300 received at block 210.

Figure 11:
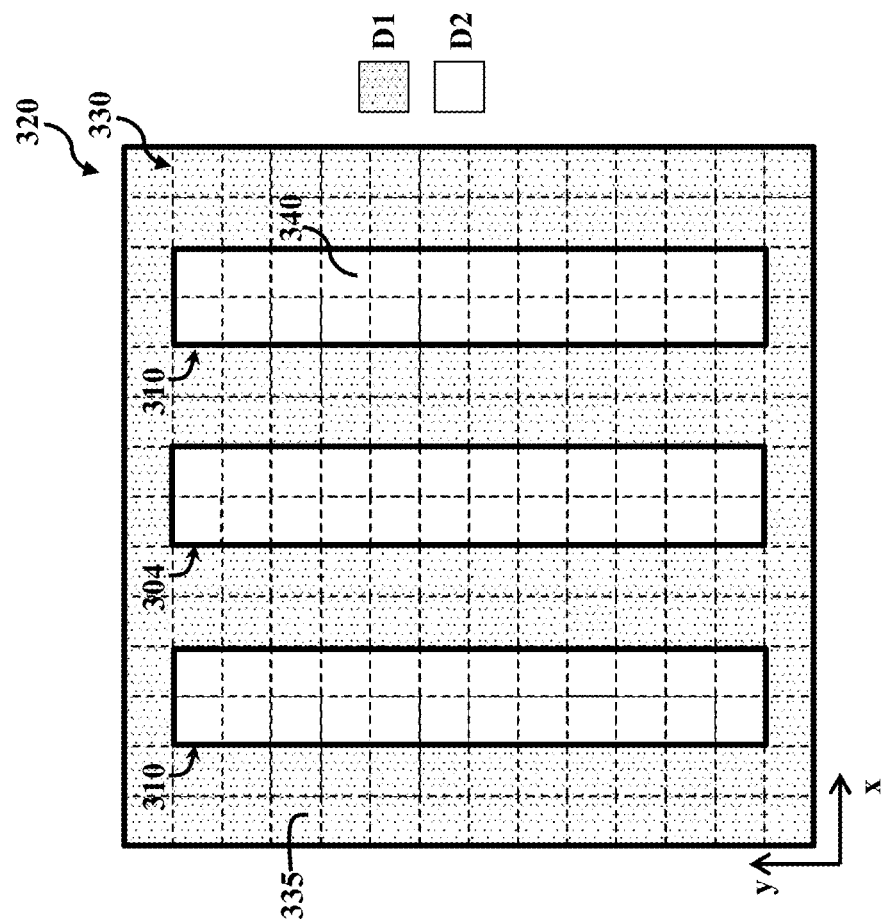
FIG. 11 is a simplified diagrammatic view of an exposure map according to various aspects of the present disclosure.

At block 240, an exposure map (layout) is generated based on the IC design layout having the target pattern and the dummy pattern. In some implementations, an exposure map is generated for each pattern area 302 of IC design layout 300, such as pattern area 302A. FIG. 11 is a simplified diagrammatic view of an exposure map 320 according to various aspects of the present disclosure. Exposure map 320 includes a target pattern (here, IC feature 304) and a dummy pattern (here, dummy features 310) defined by pattern area 302A of modified IC design layout 300. In some implementations, a pattern writing instruction set generated by DPU 106 defines exposure map 320. Exposure map 320 includes an exposure grid 330 that defines exposure conditions for writing the target pattern and the dummy pattern onto a workpiece, such as workpiece 102. For example, exposure grid 330 includes a two-dimensional (2D) array of pixels arranged in a grid pattern having rows and columns, where each pixel has an exposure dosage (an amount of energy deposited per unit area) and a location address (corresponding to its coordinates within exposure grid 330). Each pixel of the 2D pixel array has a size, such as an area defined by a respective length and a respective width. In the depicted embodiment, pixels have the same shape and/or the same size, though the present disclosure contemplates embodiments where the pixels have varying shapes and/or sizes. In some implementations, each pixel represents a minimum resolution that can be achieved by an energy beam, such as electron beam 140. In some implementations, pixels are represented as dots or squares in a Cartesian coordinate system.

In some implementations, during a lithography process, electron beam system 100 scans each exposure field 150 based on exposure grid 330, such that the target pattern and the dummy pattern defined by pattern area 302A of IC design layout 300 is transferred to each exposure field 150 (as shown in FIG. 2). To transfer the target pattern and the dummy pattern onto an exposure field (such as exposure field 150), pixels are designated as dark pixels or bright pixels. In the depicted embodiment, pixels outside perimeters of defined IC features and defined dummy features are designated as dark pixels 335, and pixels within perimeters of the defined IC features and the defined dummy features are designated as bright pixels 340. Dark pixels 335 are assigned an exposure dose D1, and bright pixels 340 are assigned an exposure dose D2, where exposure dose D2 is greater than exposure dose D1. In some implementations, exposure dose D1 is a minimum intensity achievable by a lithography system (for example, achievable by electron beam system 100 blanking electron beam 140), and exposure dose D2 is a maximum intensity achievable by the lithography system (for example, achievable by electron beam system 100 un-blanking electron beam 140). In some implementations, exposure dose D1 is pre-defined exposure intensity, and exposure dose D2 is any exposure intensity greater than the pre-defined exposure intensity. In some implementations, pixels of exposure grid 330 are assigned exposure dosages (for example, gray levels) between a minimum exposure dose (for example, 0%) and a maximum exposure dose (for example, 100%). In some implementations, a maximum exposure dose is equal to $D_T$ plus PEC required for a pattern area having $PD_{TH}$, where exposure dose D2 is the maximum exposure dose. In such implementations, the maximum exposure dose is less than the maximum exposure dose required for IC design layout 300 received at block 210, which included pattern areas having pattern densities less than $PD_{TH}$. In some implementations, $D_T$ is a forward exposure dosage required for writing dense patterns.

A blanking instruction is generated for each pixel (for example, by DPU 106), such that EXU 108 can achieve each pixel's assigned exposure dose (here, exposure dose D1 or exposure dose D2). The blanking instruction specifies whether an energy beam, such as electron beam 140, is blanked (turned off) or un-blanked (turned on). In the depicted embodiment, dark pixels 335 are assigned an OFF blanking instruction, and bright pixels 340 are assigned ON blanking instructions. In some implementations, a deflection instruction is generated for each pixel (for example, by DPU 106), such as an ON deflection instruction or an OFF deflection instruction. In some implementations, dark pixels 335 and/or bright pixels 340 may be assigned an ON blanking instruction and an ON deflection instruction. Typically, electron beam system 100 implements the blanking instructions and the deflection instructions defined by exposure map 320 to scan each exposure field 150 pixel-by-pixel, blanking electron beam 140 when exposing workpiece 102 to dark pixels 335 and un-blanking charged particle beam 140 when exposing workpiece 102 to bright pixels 340, thereby transferring the target pattern and the dummy pattern defined by pattern area 302A of modified IC design layout 300 to each exposure field 150 of workpiece 102.

Turning again to FIG. 4, method 200 can continue at block 250, where a lithography process is performed based on the exposure map. For example, electron beam system 100 performs an electron beam exposure process on workpiece 102 as described herein to write a target pattern (including, for example, IC feature 304) and a dummy pattern (including, for example, dummy features 310, dummy features 312, dummy feature 314, and/or dummy feature 316) on recording medium 104 using an electron beam. The writing implements an exposure dose that varies from $D_T$ to a maximum exposure dose (in other words, $D_T$+PEC for $PD_{TH}$ (here, 25%)). Since the maximum exposure dosage is reduced by implementing the techniques disclosed herein (in particular, from $D_T$+PEC for 0% PD (or 20% PD) to $D_T$+PEC for 25%), a scan speed of electron beam lithography system can be increased, thereby improving throughput while maintaining critical dimension and overlay control.

Figure 12:
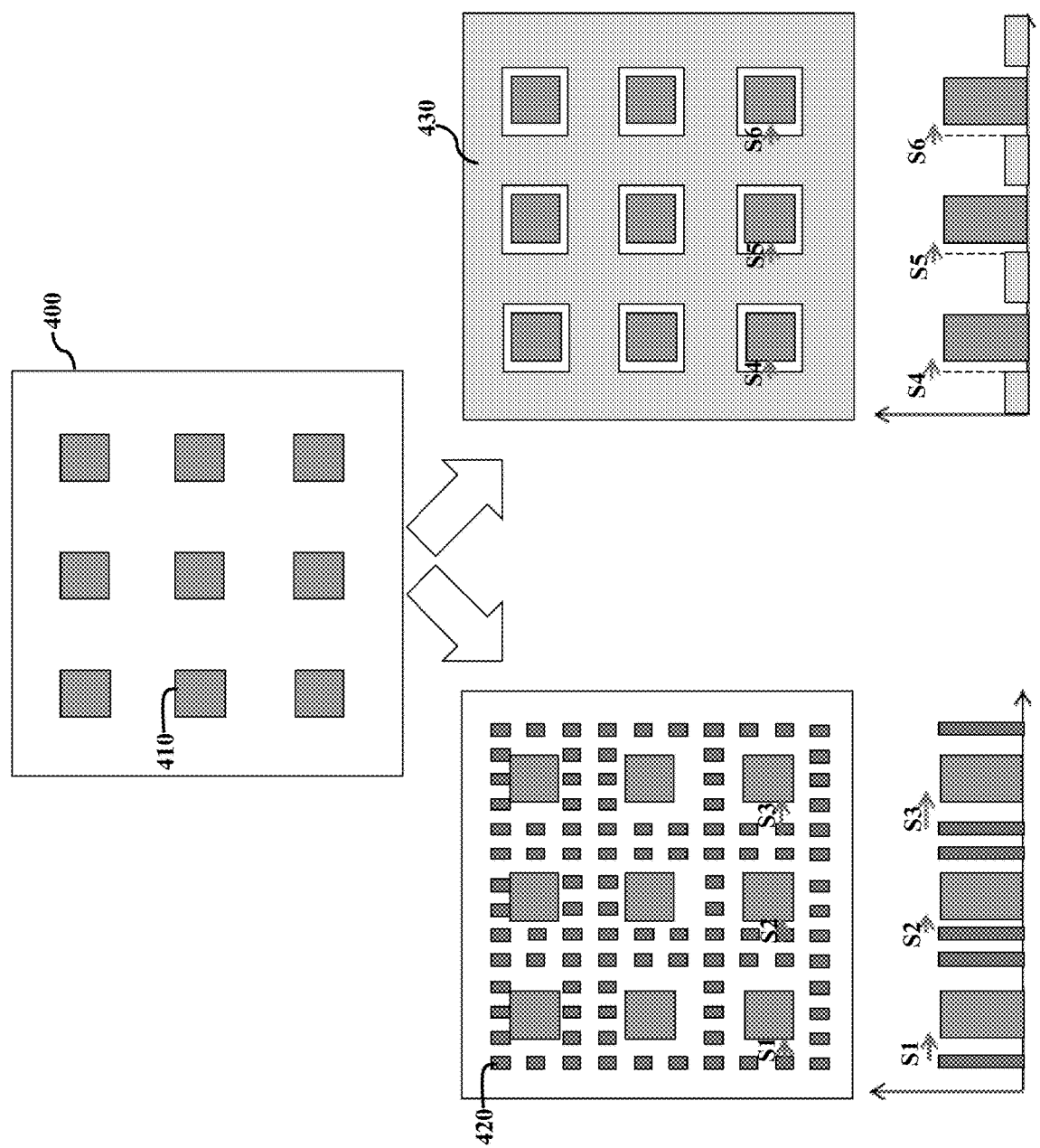
FIG. 12 is a simplified diagrammatic view of an IC design layout as it undergoes a method for increasing throughput achieved by an electron beam lithography system according to various aspects of the present disclosure.

FIG. 12 is a simplified diagrammatic view of an IC design layout 400 as it undergoes a method for increasing throughput achieved by an electron beam lithography system, such as described above with reference to FIGS. 1-11, according to various aspects of the present disclosure. IC design layout 400 includes a main pattern (or target pattern) for a via layer of an IC device. The main pattern includes an array of via features 410. In some implementations, a dummy pattern including an array of sub-resolution features 420 is inserted into IC design layout 400, where the sub-resolution features 420 are arranged relative to via features 410. Because a pitch of sub-resolution features 420 may vary along a given row of sub-resolution features 420, sub-resolution features 420 closest to via features 410 along the given row may exhibit different spacing from has different spacing from such via features 410, such as S1, S2, and S3, where S2 is less than S1 and S3, and S1 is less than S3. In some implementations, a dummy pattern including an under-threshold assistant feature 430 is inserted into IC design layout 400, where under-threshold assistant feature 430 is arranged relative to via features 410. Such results in the same spacing between via features 410 and under-threshold assistant feature 430, such as S4, S5, and S6, where S4=S5=S6. In some implementations, maintaining the same spacing between the main pattern and the dummy pattern may be critical to achieving desired image contrast. In such implementations, under-threshold assistant features can provide better uniformity.

In yet other implementations, where an IC design layout includes a main pattern for a via layer having a very low pattern density (for example, less than 10%), the present disclosure further proposes reversing the IC design layout with a reverse process to achieve higher throughput. For example, writing a sparse via layout using a positive resist leads to very low PD (for example, PD=10%), which requires larger PEC for writing a via pattern based on the via layout, which can reduce throughput of an electron beam system. Implementing a negative resist, as proposed, when writing the sparse layout reverses PD (for example, PD=90%, instead of 10%), such that a minimal amount of PEC is needed for writing the via pattern, which can significantly increase throughput of the electron beam system.

In some implementations, electron beam lithography system 100 includes a computer with a processor, a memory, and an I/O interface. The computer can be coupled to DPU 106, EXU 108, various components of DPU 106 and/or EXU 108 (for example, electron beam source 114), stage 130, an IC database (in some implementations, that stores computer files, such as GDS files and/or OASIS files of IC design layouts), and/or other component to perform one or more of the operations described herein. Some common forms of computer readable media used in the present disclosure may include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, carrier wave, or any other medium from which a computer is adapted to read. These media may be used to store and/or implement the embodiments discussed herein including those of FIGS. 1-12. Furthermore, in some implementations, an apparatus is provided including a computer readable medium that stores a plurality of instructions for execution by at least one computer processor. The instructions are for performing the operations described herein, such as those in FIGS. 1-12.

The present disclosure provides for various embodiments. Lithography systems and lithography methods are disclosed herein for improving throughput. Though the present disclosure describes the throughput enhancement techniques with reference to an electron beam system, the present disclosure also contemplates implementing the throughput enhancement techniques described herein by any lithography system operating in a raster mode. As one non-limiting example, the throughput enhancement techniques can be implemented by a photon beam, an ion beam, and/or a laser beam lithography system operating in raster mode.

An exemplary method for increasing throughput achieved by an electron beam lithography system includes receiving an integrated circuit (IC) design layout that includes a target pattern, wherein the electron beam lithography system can implement a first exposure dose to form the target pattern on a workpiece based on the IC design layout. The method further includes inserting a dummy pattern into the IC design layout to increase a pattern density of the IC design layout to greater than or equal to a threshold pattern density, thereby generating a modified IC design layout. The electron beam lithography system can implement a second exposure dose that is less than the first exposure dose to form the target pattern on the workpiece based on the modified IC design layout. In some implementations, the method further includes writing the target pattern into an energy sensitive layer using an electron beam based on the modified IC design layout, wherein the writing implements the second exposure dose.

In some implementations, the threshold pattern density is 25%. In some implementations, inserting the dummy pattern includes adding a full size assistant feature to the IC design layout, adding a sub-resolution assistant feature to the IC design layout, and/or adding an under-threshold assistant feature to the IC design layout. In some implementations, the under-threshold assistant feature is added to the IC design layout, such that a gap exists between the target pattern and the under-threshold assistant feature. In some implementations, the under-threshold assistant feature is added to the IC design layout, such that no gap exists between the target pattern and the under-threshold assistant feature. In some implementations, when the pattern density of the IC design layout is greater than or equal to the threshold pattern density, the method further includes writing the target pattern into an electron beam sensitive layer using an electron beam using the first exposure dose based on the IC design layout.

Another exemplary method for increasing throughput achieved by an electron beam lithography system includes receiving an integrated circuit (IC) design layout having a target pattern, determining a pattern density of pattern areas of the IC design layout, and inserting a dummy feature into any pattern area having a pattern density that is less than a threshold pattern density, thereby generating a dummy pattern for the IC design layout. In some implementations, the method further includes generating an exposure map based on the IC design layout having the target pattern and the dummy pattern. In some implementations, the method further includes performing an electron beam lithography process based on the exposure map.

In some implementations, the electron beam lithography process implements a first maximum exposure dose that is less than a second maximum exposure dose implemented when the electron beam lithography process is performed based on an exposure map generated from the IC design layout having only the target pattern. In some implementations, the first maximum exposure dose includes a threshold exposure dose and a proximity effect correction dose for the threshold pattern density. In some implementations, the target pattern includes an array of via features, and the inserting the dummy feature includes inserting an array of sub-resolution assistant features relative to the array of via features. In some implementations, each via feature is surrounded by a set of the array of sub-resolution assistant features according to a respective spacing. In some implementations, the target pattern includes an array of via features, and the inserting the dummy feature includes inserting an under-threshold assistant feature relative to the array of via features. In some implementations, spacing between each via feature and the under-threshold assistant feature is the same.

Yet another exemplary method for increasing throughput achieved by a charged particle beam lithography system includes receiving an integrated circuit (IC) design layout that includes a target pattern. When a pattern density of the IC design layout is greater than or equal to a threshold pattern density, the method includes generating an exposure map based on the IC design layout. When the pattern density of the IC design layout is less than the threshold pattern density, the method includes inserting a dummy pattern into the IC design layout, thereby generating a modified IC design layout and generating an exposure map based on the modified IC design layout. In some implementations, when the pattern density of the IC design layout is greater than or equal to the threshold pattern density, the method further includes raster scanning a workpiece to write the target pattern on an energy sensitive layer according to the exposure map based on the IC design layout. In some implementations, when the pattern density of the IC design layout is less than the threshold pattern density, the method further comprising raster scanning the workpiece to write the target pattern on the energy sensitive layer according to the exposure map based on the modified IC design layout.

An exemplary method for electron beam lithography includes receiving a substrate having an energy sensitive layer disposed thereon and writing a target pattern and a dummy pattern on the energy sensitive layer using an electron beam. The writing implements an exposure dose that varies from a threshold dose to a maximum exposure dose. The maximum exposure dose is the threshold dose plus a proximity effect correction dose for a threshold pattern density. In some implementations, the method further includes developing the energy sensitive layer after the writing, wherein the developed energy sensitive layer includes the target pattern.

The present disclosure is designed to work on any architecture. For example, the electron beam system and method described herein may be executed on a single computer, local area networks, client-server networks, wide area networks, internets, hand-held and other portable and wireless devices and networks. Such architecture can take the form of an entirely hardware embodiment, an entirely software embodiment, or an embodiment containing both hardware and software elements. Hardware generally includes at least processor-capable platforms, such as client-machines (also known as personal computers or servers), and hand-held processing devices (such as smart phones, personal digital assistants (PDAs), or personal computing devices (PCDs), for example). Hardware can include any physical device that is capable of storing machine-readable instructions, such as memory or other data storage devices. Other forms of hardware include hardware sub-systems, including transfer devices such as modems, modem cards, ports, and port cards, for example. Software generally includes any machine code stored in any memory medium, such as RAM or ROM, and machine code stored on other devices (such as floppy disks, flash memory, or a CDROM, for example). Software can include source or object code, for example. In addition, software encompasses any set of instructions capable of being executed in a client machine or server.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for increasing throughput achieved by an electron beam lithography system, the method comprising:
   receiving an integrated circuit (IC) design layout having a target pattern area with a first pattern density, wherein the electron beam lithography system implements a first exposure dose to write an IC feature on a workpiece based on the IC design layout; and
   generating a modified IC design layout having a modified target pattern area with a second pattern density that is greater than the first pattern density, wherein:

the generating includes inserting a dummy pattern into the target pattern area, the first pattern density is less than a threshold pattern density and the second pattern density is greater than or equal to the threshold pattern density, the threshold pattern density is a pattern density corresponding with a proximity effect correction dose that the electron beam lithography system can implement without exceeding a maximum exposure dosage limit of the electron beam lithography system, and the electron beam lithography system implements a second exposure dose that is less than the first exposure dose to write the IC feature on the workpiece based on the modified IC design layout.

2. The method of claim 1, wherein:

the dummy pattern has dimensions that are greater than a resolution of the electron beam lithography system; and the electron beam lithography system implements a third exposure dose that is less than the first exposure dose to write a dummy IC feature that corresponds with the dummy pattern on the workpiece based on the modified IC design layout, wherein the dummy IC feature contributes backscattering energy for writing the IC feature.

3. The method of claim 2, wherein:

the inserting the dummy pattern into the target pattern area includes inserting a first dummy feature and a second dummy feature into the target pattern area, such that a target IC feature of the target pattern area is disposed between the first dummy feature and the second dummy feature; and the target IC feature corresponds with the IC feature, the first dummy feature and the second dummy feature correspond with the dummy IC feature, and the first dummy feature, the second dummy feature, and the target IC feature have the same dimensions.

4. The method of claim 1, wherein:

the dummy pattern has dimensions that are less than a resolution of the electron beam lithography system; and the electron beam lithography system implements a third exposure dose that is less than the first exposure dose to expose a dummy IC feature that corresponds with the dummy pattern on the workpiece based on the modified IC design layout, wherein the dummy IC feature is not written on the workpiece by the electron beam lithography system and the dummy IC feature contributes backscattering energy for writing the IC feature.

5. The method of claim 4, wherein:

the inserting the dummy pattern into the target pattern area includes inserting a dummy feature array into the target pattern area, such that a target IC feature of the target pattern area is surrounded by dummy features of the dummy feature array; and the target IC feature corresponds with the IC feature, the dummy features of the dummy feature array correspond with the dummy IC feature, and dimensions of the dummy features of the dummy feature array are less than dimensions of the target IC feature.

6. The method of claim 4, wherein:

the inserting the dummy pattern into the target pattern area includes inserting a dummy feature array into the target pattern area, such that a first target IC feature of the target pattern area is a first distance from a first dummy feature of the dummy feature array, a second target IC feature of the target pattern area is a second distance from a second dummy feature of the dummy feature array, and the second distance is different than the first distance; and the first target IC feature and the second target IC feature correspond with the IC feature, the first dummy feature and the second dummy feature of the dummy feature array correspond with the dummy IC feature, dimensions of the first dummy feature are less than dimensions of the first target IC feature, and dimensions of the second dummy feature of the dummy feature array are less than dimensions of the second target IC feature.

7. The method of claim 6, wherein the first dummy feature and the second dummy feature are in a same row of the dummy feature array.

8. The method of claim 1, wherein:

the dummy pattern has dimensions that are greater than a resolution of the electron beam lithography system;

the electron beam lithography system implements a third exposure dose that is less than the first exposure dose to expose a dummy IC feature that corresponds with the dummy pattern on the workpiece based on the modified IC design layout, wherein the dummy IC feature is not written on the workpiece by the electron beam lithography system and the dummy IC feature contributes backscattering energy for writing the IC feature; and the second exposure dose is greater than a threshold exposure dose, the third exposure dose is less than the threshold exposure dose, and the threshold exposure dose is an amount of electron beam energy that causes an exposed region of an energy sensitive layer to have solubility characteristics specific to a given developer.

9. The method of claim 1, wherein:

the inserting the dummy pattern into the target pattern area includes inserting a dummy feature that substantially fills a background area of the target pattern area, wherein a first target IC feature of the target pattern area is a first distance from the dummy feature, a second target IC feature of the target pattern area is a second distance from the dummy feature, and the second distance is the same as the first distance; and the first target IC feature and the second target IC feature correspond with the IC feature and the dummy feature corresponds with a dummy IC feature.

10. The method of claim 1, wherein the threshold pattern density is 25%.

11. A charged particle beam lithography method comprising:

receiving a workpiece having an energy sensitive layer disposed thereon;

receiving an integrated circuit (IC) design layout having a target pattern area that includes a target feature and a dummy feature, wherein a pattern density of the target pattern area is greater than or equal to a threshold pattern density;

generating a first exposure map based on the IC design layout having the target pattern area that includes the target feature and the dummy feature;

exposing the energy sensitive layer to a charged particle beam based on the generated first exposure map, wherein:

a first region of the energy sensitive layer that corresponds with the target feature is exposed to a first dose of the charged particle beam, a second region of the energy sensitive layer that corresponds with the dummy feature is exposed to a second dose of the charged particle beam, and a third region of the energy sensitive layer that corresponds with a space between the target feature and the dummy feature is exposed to a third dose of the charged particle beam, the third dose is less than the first dose and the second dose, and the first dose is less than a fourth dose implemented for exposing the first region when the energy sensitive layer is exposed to the charged particle beam based on a second exposure map that is generated when the target pattern area includes the target feature without the dummy feature; and developing the energy sensitive layer after the exposing, wherein the developed energy sensitive layer includes a patterned target feature that corresponds with the target feature.

12. The charged particle beam lithography method of claim 11, wherein:

the dummy feature has dimensions that are greater than a resolution of a charged particle beam lithography system used to expose the energy sensitive layer to the charged particle beam;

the second dose is the same as the first dose; and the developed energy sensitive layer further includes a patterned dummy feature that corresponds with the dummy feature.

13. The charged particle beam lithography method of claim 11, wherein:

the dummy feature has dimensions that are less than a resolution of a charged particle beam lithography system used to expose the energy sensitive layer to the charged particle beam;

the second dose is the same as the first dose; and the developed energy sensitive layer does not include a patterned dummy feature that corresponds with the dummy feature.

14. The charged particle beam lithography method of claim 11, wherein:

the dummy feature has dimensions that are greater than a resolution of a charged particle beam lithography system used to expose the energy sensitive layer to the charged particle beam;

the second dose is less than the first dose; and the developed energy sensitive layer does not include a patterned dummy feature that corresponds with the dummy feature.

15. The charged particle beam lithography method of claim 11, wherein:

the first dose includes a first forward exposure dosage plus a first proximity effect correction dosage; and the fourth dose includes a second forward exposure dosage plus a second proximity effect correction dosage, wherein the second proximity effect correction dosage is greater than the first proximity effect correction dosage.

16. The charged particle beam lithography method of claim 15, wherein the second dose includes a third forward exposure dosage and the third forward exposure dosage is the same as the first forward exposure dosage.

17. The charged particle beam lithography method of claim 15, wherein the second dose includes a third forward exposure dosage and the third forward exposure dosage is less than the first forward exposure dosage.

18. The charged particle beam lithography method of claim 17, wherein the third forward exposure dosage is 75% of a threshold energy dosage, wherein the threshold energy dosage changes solubility characteristics in the energy sensitive layer.

19. A charged particle beam lithography method comprising:

exposing a first region of an energy sensitive layer that corresponds with a target feature to a first dose of a charged particle beam, wherein the target feature is in a target pattern area of an integrated circuit (IC) design layout;

exposing a second region of the energy sensitive layer that corresponds with a dummy feature to a second dose of the charged particle beam, wherein the dummy feature is in the target pattern area of the IC design layout;

removing an unexposed region of the energy sensitive layer that corresponds with a background area in the target pattern area of the IC design layout; and wherein the first dose is less than a third dose implemented for exposing the first region of the energy sensitive layer when the target pattern area of the IC design layout includes the target feature without the dummy feature.

20. The charged particle beam lithography method of claim 19, wherein:

the first dose includes a first forward exposure dosage plus a first proximity effect correction dosage; and the third dose includes a second forward exposure dosage plus a second proximity effect correction dosage, wherein the second proximity effect correction dosage is greater than the first proximity effect correction dosage.

* * * * *